United States Patent
Cullum et al.

(10) Patent No.: US 7,548,483 B2
(45) Date of Patent: *Jun. 16, 2009

(54) MEMORY DEVICE AND METHOD HAVING MULTIPLE ADDRESS, DATA AND COMMAND BUSES

(75) Inventors: James Cullum, Boise, ID (US); Jeffrey Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/900,296

(22) Filed: Sep. 10, 2007

(65) Prior Publication Data

US 2008/0043565 A1   Feb. 21, 2008

Related U.S. Application Data

(63) Continuation of application No. 11/190,270, filed on Jul. 26, 2005, now Pat. No. 7,283,418.

(51) Int. Cl.
   *G11C 8/00* (2006.01)
(52) U.S. Cl. .............. 365/230.03; 365/230.02; 365/230.06; 365/189.02; 365/189.18
(58) Field of Classification Search ............ 365/230.03, 365/230.02, 230.06, 189.02, 189.01, 189.18; 711/103–105, 154, 217
   See application file for complete search history.

(56) References Cited

U.S. PATENT DOCUMENTS

| 4,266,270 A | 5/1981 | Daniels et al. ............ 364/200 |
|---|---|---|
| 4,309,754 A | 1/1982 | Dinwiddie, Jr. ............ 364/200 |
| 4,360,891 A | 11/1982 | Branigin et al. ............ 364/900 |
| 4,462,029 A | 7/1984 | Neumann et al. ........ 340/825.5 |
| 4,837,785 A | 6/1989 | McAlpine ............... 370/85 |
| 5,075,892 A | 12/1991 | Choy ............... 382/61 |
| 5,243,699 A | 9/1993 | Nickolls et al. ............ 395/275 |
| 5,307,506 A | 4/1994 | Colwell et al. ............ 395/800 |
| 5,414,866 A | 5/1995 | Ohmae ............... 395/936 |
| 5,416,743 A | 5/1995 | Allan et al. ............ 365/203 |
| 5,490,253 A | 2/1996 | Laha et al. ............ 395/304 |
| 5,631,865 A | 5/1997 | Iwase et al. ............ 365/189.01 |
| 5,650,967 A | 7/1997 | Seibert ............ 365/185.33 |
| 5,668,956 A | 9/1997 | Okazawa et al. ............ 395/306 |
| 5,715,025 A | 2/1998 | Ogurtsov et al. ............ 349/41 |
| 5,751,999 A | 5/1998 | Suzuki ............ 395/494 |
| 5,822,261 A | 10/1998 | Suh ............ 365/207 |
| 5,889,971 A | 3/1999 | Okazawa et al. ............ 395/306 |
| 6,006,302 A | 12/1999 | Okazawa et al. ............ 710/129 |
| 6,098,136 A | 8/2000 | Okazawa et al. ............ 710/128 |
| 6,195,296 B1 | 2/2001 | Cheol ............ 365/189.05 |
| 6,333,890 B1 | 12/2001 | Niimi et al. ............ 365/230.03 |

(Continued)

*Primary Examiner*—David Lam
(74) *Attorney, Agent, or Firm*—Dorsey & Whitney LLP (57) ABSTRACT

A dynamic random access memory ("DRAM") device includes a pair of internal address buses that are selectively coupled to an external address bus by an address multiplexer, and a pair of internal data buses that are selectively coupled to an external data bus by a data multiplexer. The DRAM device also includes a bank multiplexer for each bank of memory cells that selectively couples one of the internal address buses and one of the internal data buses to the respective bank of memory cells. Select signals generated by a command decoder cause the multiplexers to select alternate internal address and data buses responsive to each memory command received by the command decoder.

25 Claims, 6 Drawing Sheets

U.S. PATENT DOCUMENTS

| | | |
|---|---|---|
| 6,334,164 B1 | 12/2001 | Okazawa et al. ............. 710/129 |
| 6,343,035 B1 | 1/2002 | Kubo et al. ............. 365/189.05 |
| 6,366,503 B2 | 4/2002 | Sonoda .................. 365/189.05 |
| 6,373,777 B1 | 4/2002 | Suzuki .................. 365/230.03 |
| 6,462,997 B2 | 10/2002 | Sugamoto et al. ........... 365/203 |
| 6,510,097 B2 | 1/2003 | Fukuyama ............. 365/230.03 |
| 6,615,341 B2 | 9/2003 | Sih et al. .................... 712/221 |
| 6,625,684 B1 | 9/2003 | Casey et al. ................. 710/316 |
| 6,650,582 B2 | 11/2003 | Matsumoto et al. ......... 365/201 |
| 6,744,657 B2 | 6/2004 | Agata .......................... 365/63 |
| 6,772,262 B1 | 8/2004 | Park et al. ................... 710/301 |
| 6,789,174 B2 | 9/2004 | Konishi et al. .............. 711/150 |
| 6,798,711 B2 | 9/2004 | Bell et al. ............. 365/230.08 |
| 6,810,461 B2 | 10/2004 | Okazawa et al. ............. 710/306 |
| 6,854,036 B2 | 2/2005 | Bosisio et al. .............. 711/147 |
| 6,906,960 B2 * | 6/2005 | Saito et al. ............. 365/185.29 |
| 6,928,024 B2 * | 8/2005 | Pfeiffer et al. ......... 365/230.03 |
| 6,941,414 B2 | 9/2005 | Hsu et al. ................... 711/105 |
| 6,961,264 B2 | 11/2005 | Tsuchida .................... 365/158 |
| 7,283,418 B2 * | 10/2007 | Cullum et al. ......... 365/230.03 |
| 2001/0003836 A1 | 6/2001 | Maclellan et al. ........... 710/113 |
| 2002/0049890 A1 | 4/2002 | Boisisio et al. ............. 711/146 |
| 2002/0062414 A1 | 5/2002 | Hofmann et al. ........... 710/110 |
| 2002/0065972 A1 | 5/2002 | Okazawa et al. ............. 710/305 |
| 2002/0138710 A1 | 9/2002 | Sih et al. ....................... 712/33 |
| 2002/0163369 A1 | 11/2002 | Peller et al. ................. 327/144 |
| 2003/0105899 A1 | 6/2003 | Rosenbluth et al. ......... 710/104 |
| 2004/0037133 A1 | 2/2004 | Park et al. .................... 365/202 |
| 2004/0158362 A1 | 8/2004 | Fuehrer et al. .................. 701/1 |
| 2004/0168007 A1 | 8/2004 | Okazawa et al. ............. 710/305 |
| 2004/0260859 A1 | 12/2004 | Park et al. ....................... 711/1 |
| 2005/0105379 A1 | 5/2005 | Mizuhashi .................. 365/233 |
| 2005/0117390 A1 | 6/2005 | Tsuchida .................... 365/171 |
| 2005/0125585 A1 | 6/2005 | Okazawa et al. ............. 710/305 |
| 2006/0023554 A1 * | 2/2006 | Matsushita et al. ........ 365/230.3 |
| 2006/0190688 A1 | 8/2006 | Van Eijndhoven et al. .. 711/137 |

* cited by examiner

MEMORY DEVICE AND METHOD HAVING MULTIPLE ADDRESS, DATA AND COMMAND BUSES

CROSS-REFERENCE TO RELATED APPLICATION

This application is a continuation of U.S. patent application Ser. No. 11/190,270 filed Jul. 26, 2005, now U.S. Pat. No. 7,283,418.

TECHNICAL FIELD

This invention relates to memory devices, and, more particularly, to a memory device and method that has multiple internal buses to provide increased performance.

BACKGROUND OF THE INVENTION

Maximizing memory bandwidth, i.e., the rate at which data can be written or read, is an important factor in memory device performance. Memory bandwidth has been increased to some extent by prefetching data so that the data will be available when it is called for by a received memory command. As memory bandwidth demands have increased, the amount of data that is prefetched for each read or applied to the memory device for each write has continued to increase as well. However, simply continuing to increase the amount of date prefetched results in a great deal of data being prefetched from a single location in memory. Taken to its extremes, data from an entire page of memory will be prefetched. Unfortunately, such a large amount of data from a single location is often not desired. It would be desirable to be able to prefetch smaller amounts of data from different banks at the same time. Yet the internal structure of memory devices, such as dynamic random access memory ("DRAM") devices precludes them from operating in a manner that provides more flexibility in data prefetch locations.

Figure 1:
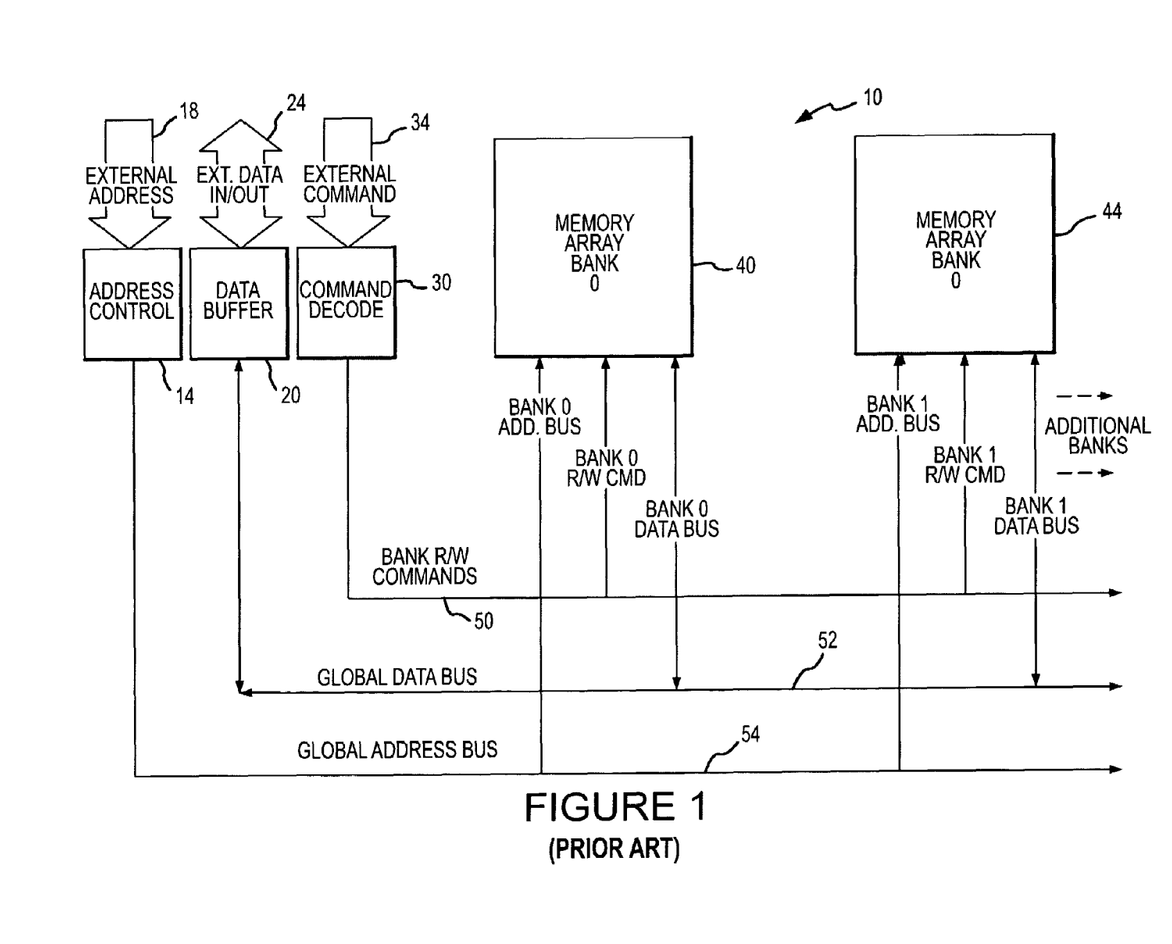
FIG. 1 is a block diagram of a portion of a conventional memory device having a single set of address, control and data buses.

A portion of a typical DRAM device 10 is shown in FIG. 1. The DRAM device 10 includes an address buffer 14 that receives bank, row and column addresses through an external address bus 18. A bi-direction data buffer 20 receives write data through an external data bus 24, and outputs read data to the data bus 24. Finally, a command decoder 30 receives and decodes memory commands, such as read command and write commands, through an external command bus 34. The DRAM device 10 also includes other circuitry as will be appreciated by one skilled in the art, but, in the interest of brevity, such circuitry has been omitted from FIG. 1.

The DRAM device 10 includes first and second memory array banks 40, 44, although additional banks (not shown) may be included. Each of the banks 40, 44 contains a large number of memory cells arranged in rows and columns. In response to read or write command signals received from the command decoder 30 through an internal command bus 50, data are coupled through an internal global data bus 52 to or from one of the banks 40, 44. The particular row to which the data are written or from which the data are read is designated by a row address received from the address buffer 14 through an internal global address bus 54. As is well known in the art, once a row of memory cells has been opened, the memory cells in the open row can be readily accessed. As a result, data in an open row can be easily prefetched. It requires substantially more time to open a different row in the same or a different one of the banks 40, 44. A particular column in an open row from which data are read or to which data are written is identified by a column address received from the address buffer 14.

It can be seen from FIG. 1 that the DRAM device 10 has a single internal command bus 50, a single internal data bus 52 and a single internal address bus 54. Although the internal data bus 52 may be divided into separate read data and write data paths, the data bus 52 can serve only one of the banks 40, 44 at a time. Similarly, the single internal command bus 50 and the single internal address bus 54 cannot simultaneously address and provide commands to both of the banks 40, 44. As a result, the DRAM device 10 is incapable of concurrently prefetching data from different rows of memory cells in the same or in different banks 40, 44.

There is therefore a need for a method and system for concurrently accessing different rows of memory cells in the same or in different banks so that prefetches of smaller block of data in different locations can occur while still providing a high memory bandwidth.

SUMMARY OF THE INVENTION

A memory device and method accesses data in a plurality of banks in a memory device through a plurality of internal address buses and a plurality of internal data buses. In response to receiving a first memory address, the memory device initiates a first memory access in a first bank of memory cells at the first memory address. While the first memory access is being processed, a second memory address is received by the memory device. A second memory access is then initiated in a second bank of memory cells in the memory device at the second memory address. This second memory access is initiated while the first memory access is being processed. In another aspect, the memory device initiates a first memory access in a first bank of memory cells responsive to a first memory command. While the first memory access is being processed, a second memory access is initiated in a second bank of memory cells in the memory device responsive to a second memory command. The memory device operating in this manner allows prefetching of data from the first bank of memory cells, and, while data are being transferred from the memory device responsive to the prefetch, a prefetch of data from a second bank of memory cells can be initiated.

DETAILED DESCRIPTION OF THE INVENTION

Figure 2:
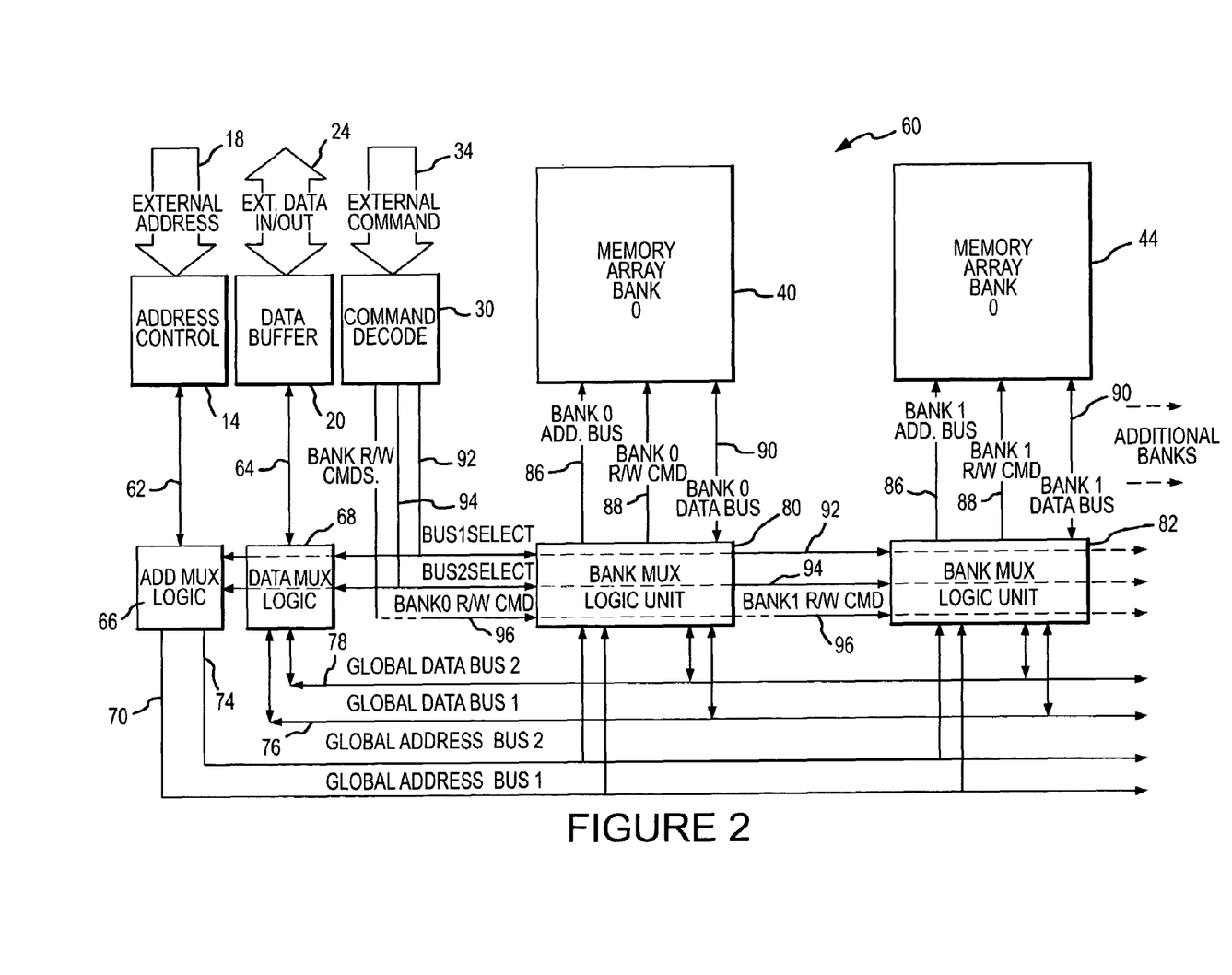
FIG. 2 is a block diagram of a portion of a memory device according to one example of the present invention in which two sets of address, control and data buses are used.
Figure 3:
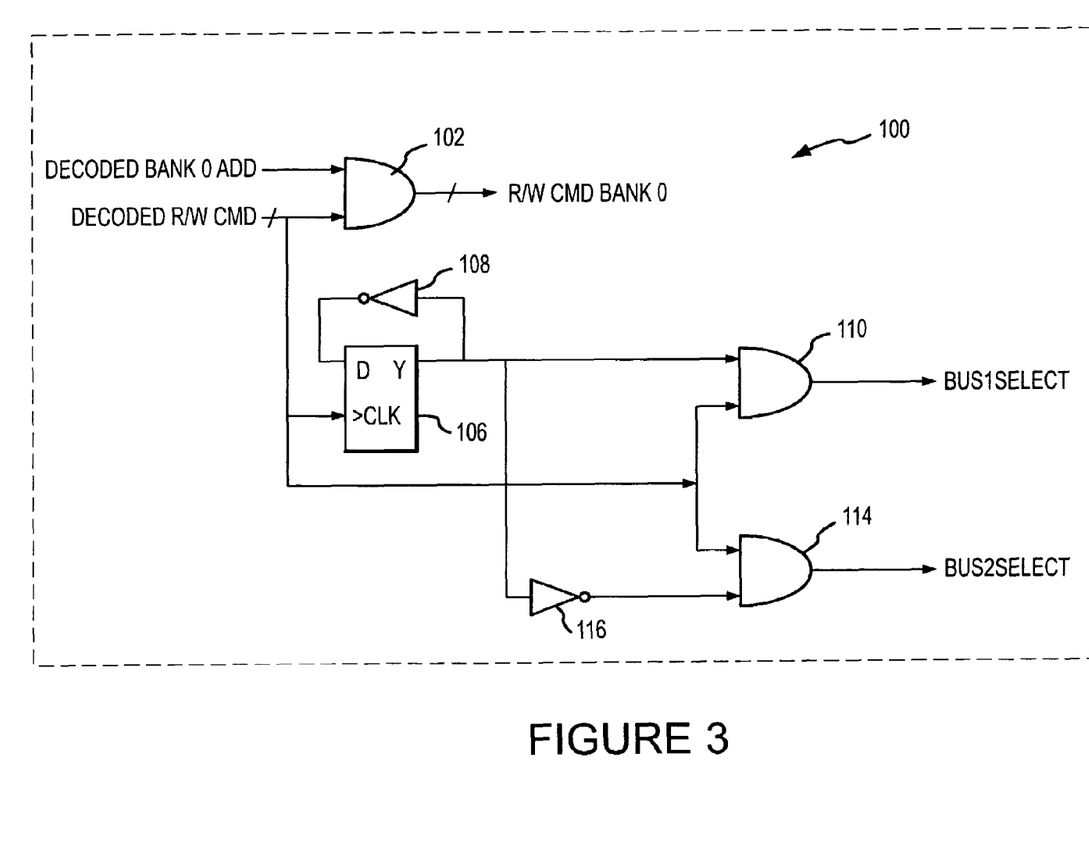
FIG. 3 is a logic diagram of one example of a command decoder used in the memory device of FIG. 2.

FIG. 2 shows a DRAM device 60 according to one example of the invention. Like the DRAM device 10 of FIG. 1, the DRAM device 60 includes several banks of memory cells, two of which 40, 44 are shown in FIG. 2. The DRAM device 60 also includes the external address, data and command buses 18, 24, 34, respectively, that are used in the DRAM 10 as well as the address buffer 14, data buffer 20 and command decoder 30 used in the DRAM 10. A more specific example of the command decoder 30 is shown in FIG. 3 and will be explained in connection with that figure.

The DRAM 60 differs from the DRAM 10 primarily in its internal bus structure, which provides it with additional performance capabilities. The DRAM device 60 also includes other circuitry as will be appreciated by one skilled in the art. However, this other circuitry is not particularly germane to the various examples of the invention. Therefore, in the interest of brevity, such circuitry has been omitted from FIG. 2.

As shown in FIG. 2, a single internal address bus 62 extends from the address buffer 14 to address multiplex logic 66. Similarly, a single internal data bus 64 extends from the data buffer 20 to data multiplex logic 68. The address multiplex logic 66 couples addresses from the address buffer 14 to either of two global address buses 70, 74. As explained in greater detail below, the global address buses 70, 74 allow two of the banks 40, 44 to be concurrently addressed. The data multiplex logic 68 couples data between from the data buffer 20 to either of two global data buses 76, 78. The global data buses 76, 78 allow write data to be coupled to or read data to be coupled from one of the banks 40, 44 at the same time write data are being coupled to or read data are being coupled from another of the banks 40, 44. More specific examples of the address multiplexer logic 66 and the data multiplexer logic 68 will be explained in connection with FIG. 5.

The global address buses 70, 74 and the global data buses 76, 78 are coupled to bank multiplexer logic units 80, 82 associated with the memory array banks 40, 44, respectively. There are also additional bank logic units (not shown) for any additional memory array banks (not shown). Each of the bank multiplexer logic units 80, 82 communicates with its respective bank 40,44 through an address bus 86, and Read/Write ("R/W") Command ("Cmd") bus 88 and a Data bus 90. The bank multiplexer logic units 80, 82 are controlled by select signals applied through lines 92, 94. The units 80, 82 also receive respective R/W Cmd signals from the command decoder 30 through a R/W Cmd bus 96, and applies those signals to the banks 40, 44 through the R/W Cmd bus 88. A more specific example of the bank multiplexer logic units 80, 82 will be explained in connection with FIG. 4.

In operation, an external command applied to the DRAM device 60 on the external command bus 34. The command decoder decodes the command, and couples signals corresponding to the decoded command to the bank multiplex logic units 80, 82. The command decoder 30 determines which global address bus 70, 74 should receive an external address applied through the external address bus 18 to the address buffer 14, and generates corresponding select signals. These select signals are applied to the address multiplexer logic 66 so that the logic 66 couples the addresses to the corresponding one of the global address buses 70, 74. The select signals are also applied to the data multiplexer logic 68 to cause the logic 68 to couple the data buffer 20 to the corresponding one of the global data buses 76, 78. Finally, the select signals are applied to the bank multiplexer logic units 80, 82 to cause them to couple the corresponding one of the global address buses 70, 74 and the corresponding one of the global data buses 76, 78 to one of the memory array banks 40, 44.

The external command preferably includes at least one bit identifying the bank 40, 44 to which the command is directed. In response to the external command, including the bank identifying bit(s), the command decoder 30 applies either Bank 0 R/W Cmd signals to the bank multiplexer logic unit 80 or Bank 1 R/W Cmd signals to the bank multiplexer logic unit 82. In response, the selected bank multiplexer logic unit 80 or 82 couples the R/W Cmd signals to the corresponding bank 40 or 44 through the R/W Cmd bus 88. In response to the bank identifying bit(s), the selected bank multiplexer logic unit 80 or 82 also couples an address from the selected global address bus 70 or 74 to the Add. Bus 86, and it couples the selected global data bus 76, 78 to the Data Bus 90. If the memory command is a read command, read data are coupled from a location in the bank 40 or 44 corresponding to the received address to the data buffer 20. If the memory command is a write command, write data from the data buffer 20 is coupled to a location in bank 40 or 44 corresponding to the received address.

The use of two internal address buses 70, 74 and two internal data buses 76, 78 allows the banks 40, 44 to be concurrently accessed in an interleaved manner. As a result, the DRAM device 60 can prefetch data in one of the banks 40 at the same time that data are being prefetched from the other bank 44. While read data are actually being coupled from one of the banks 40, 44, the other of the banks 40, 44 is preferably being prepared to output read data, such as by being equilibrated, as is well known to one skilled in the art. As a result, it may be possible to continuously couple read data from the DRAM device 60. Other modes of operation are also possible.

An example of a command decoder 100 that can be used as the command decoder 30 in the DRAM device 60 of FIG. 2 is shown in FIG. 3. The portion of the command decoder 100 that generates the Bus1 Select and Bus2 Select signals and that generates the R/W Cmd signals for Bank 0 is shown, it being understood that additional circuitry for generating R/W Cmd signals for other banks are also included. As shown in FIG. 3, a Decoded Bank 0 Add bit is active high whenever a bank address for Bank 0 is decoded by an address decoder (not shown) in the DRAM device 60. The active high Bank 0 Add bit enables a plurality of AND gates 102 (only one of which is shown in FIG. 3) to pass decoded R/W Cmd signals to the Bank Multiplexer Logic Unit 80 (FIG. 2), as explained above. Other sets of the AND gates 102 (not shown) are enabled by decoded bank bits to pass decoded R/W Cmd signals to the Bank Multiplexer Logic Units for the other banks.

The command decoder 100 also includes a flip-flop 106 that receives at a CLK input One of the Decoded R/W Cmd signals. The data ("D") input of the flip-flop 106 receives the Y output of the flip-flop 106 through an inverter 108. The Y output of the flip-flop 106 therefore toggles with each rising edge of the Decoded R/W Cmd signal. When the Y output of the flip flop 106 is high, it enables an AND gate 110 to make the Bus1 Select signal active high. When the Y output of the flip flop 106 is low, it enables an AND gate 114 through an inverter 116 to make the Bus2 Select signal active high. The Bus1 and Bus2 Select signals are therefore alternately active high responsive to each set of decoded R/W Cmd signals. As a result, the Global Address Buses 70, 74 (FIG. 2) and the Global Data Buses 76, 78 are alternately used to couple addresses to and data to and from the banks 40, 44 responsive to each memory command received from the external command bus 34.

Figure 4:
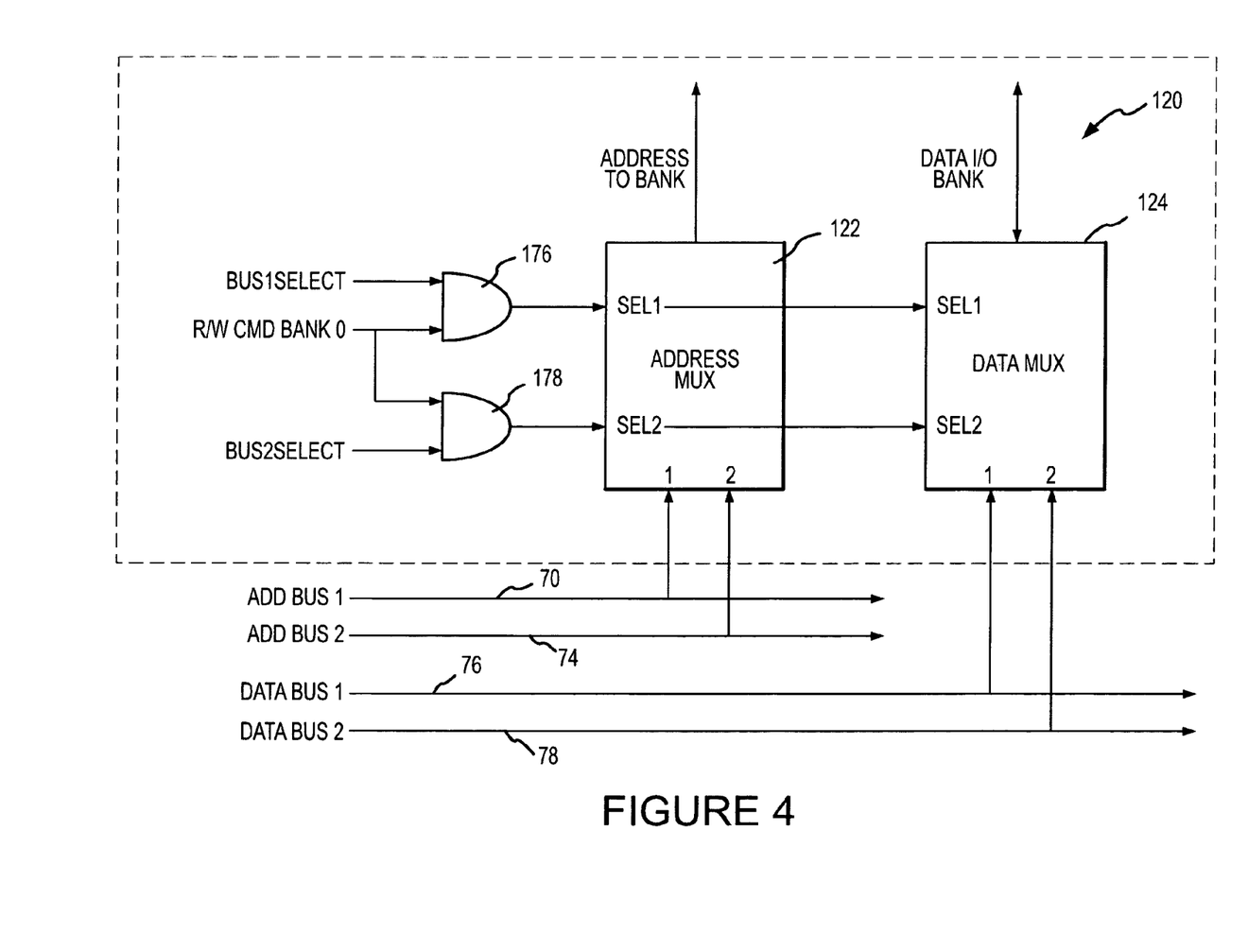
FIG. 4 is a logic diagram of one example of a bank multiplexer logic unit used in the memory device of FIG. 2.

One example of a Bank Multiplexer Logic Unit 120 that can be used as the Bank Multiplexer Logic Units 80, 82 in the DRAM device 60 of FIG. 2 is shown in FIG. 4. The Bank Multiplexer Logic Unit 120 includes an Address Multiplexer 122 that has respective input ports coupled to the Global Address Buses 70, 74, and a single output port coupled to Memory Array Bank 0 (FIG. 2). Similarly, a Data Multiplexer 124 has respective inputs coupled to the Global Data Buses 76, 78 and a single output port coupled to Memory Array Bank 0. The Multiplexers 122, 124 are controlled by common Sel1 and Sel2 signals. The Sel1 signal is generated by an AND gate 176 and the Sel2 signal is generated by an AND gate 178. The AND gates 176, 178 are enabled by one of the R/W Cmd signals for Bank 0 being active high. When the AND gates 176, 178 are enabled by a command directed to the respective bank, the AND gate 176 generates the Sel1 signal responsive to the Bus1 Select signal, and the AND gate 178 generates the Sel2 signal responsive to the Bus2 Select signal.

Figure 5:
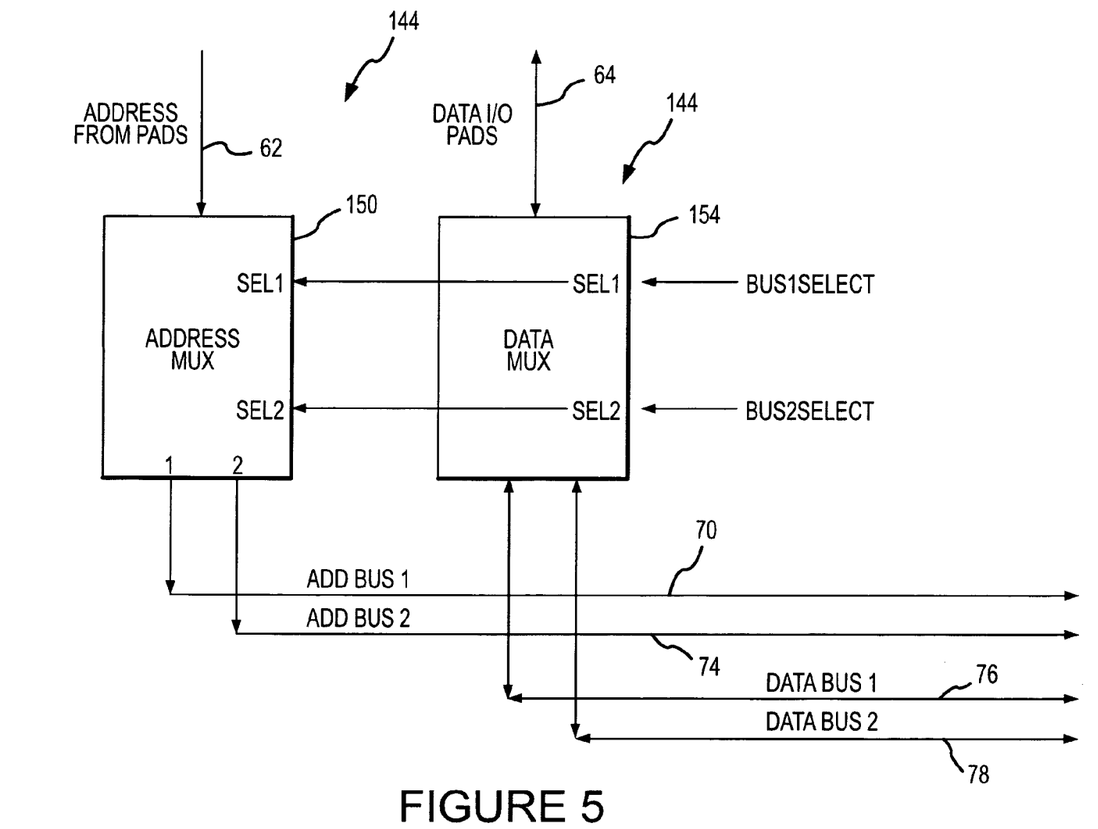
FIG. 5 is a logic diagram of one example of a address and data multiplexers used in the memory device of FIG. 2.

One example of address multiplexer logic 140 and the data multiplexer logic 144 that can be used as the address multiplexer logic 66 and the data multiplexer logic 68 in the DRAM device 60 of FIG. 2 is shown in FIG. 5. With reference to FIG. 5, the address multiplexer logic 140 and the data multiplexer logic 144 include and address multiplexer 150 and a data multiplexer 154, respectively. The address multiplexer 150 has respective input ports coupled to the Global Address Buses 70, 74, and a single output port coupled to Memory Array Bank 0 (FIG. 2). Similarly, the Data Multiplexer 1154 has respective inputs coupled to the Global Data Buses 76, 78 and a single output port coupled to Memory Array Bank 0. The Multiplexers 150, 154 are controlled by common Sel1 and Sel2 signals in the same way that the Address Multiplexer 122 (FIG. 4) and Data Multiplexer 124 in the Bank Multiplexer Logic Unit 120 are controlled. As explained above, the Sel1 and Sel2 signals are generated by the Bank Multiplexer Logic Unit 120 shown in FIG. 4.

Figure 6:
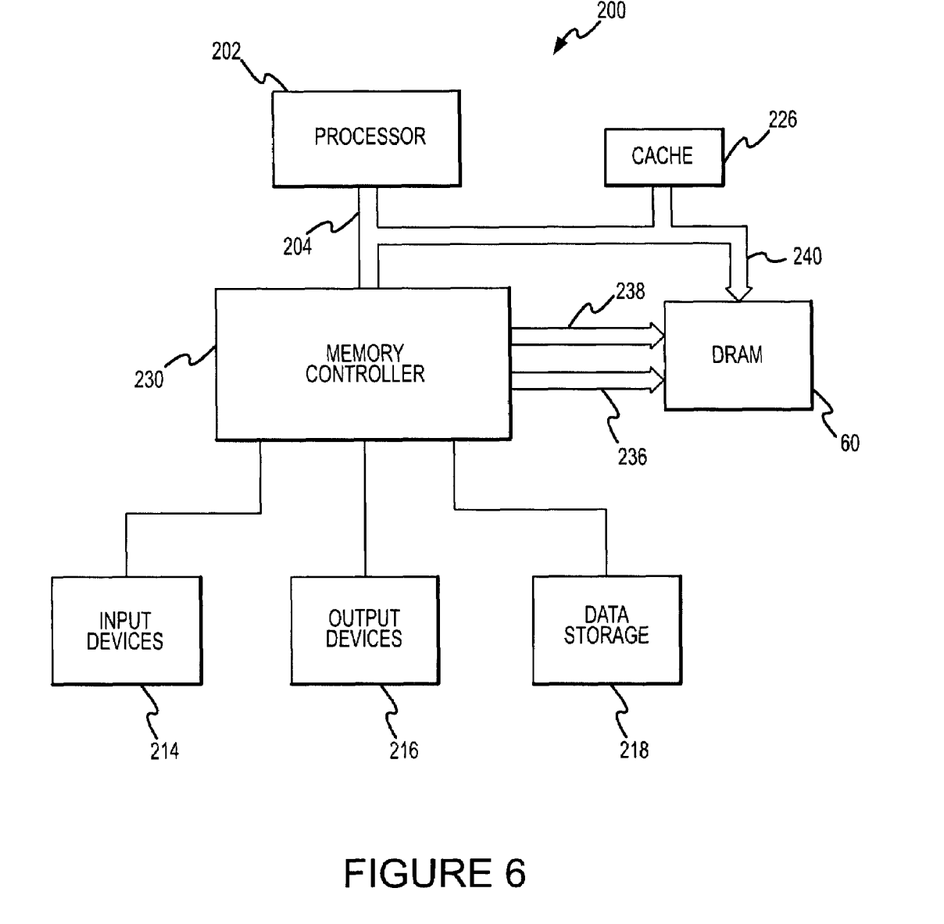
FIG. 6 is a block diagram of a computer system according to one example of the invention.

The DRAM device 60 or another example of a memory device according to the invention can be used in various electronic systems. For example, it may be used in a processor-based system, such as a computer system 200 shown in FIG. 6. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the DRAM 60 through a memory controller 230. The memory controller 230 normally includes a control bus 236 and an address bus 238 that are coupled to the DRAM 60. A data bus 240 is coupled from the DRAM 60 to the processor bus 204 either directly (as shown), through the memory controller 230, or by some other means.

From the foregoing it will be appreciated that, although specific embodiments of the invention have been described herein for purposes of illustration, it will be understood by one skilled in the art that various modifications may be made without deviating from the spirit and scope of the invention. For example, FIGS. 3 and 4 show various components implemented using specific logic elements, such as AND gates. However, it will be understood that these and other components can be implemented with other types of gates or logic elements or other circuitry. Accordingly, the invention is not limited except as by the appended claims.

What is claimed is:

1. A memory device, comprising:
    an external port adapted to receive memory command signals, memory address signals and write data signals and to transmit read data signals from the memory device;
    a plurality of internal address buses;
    an address coupling circuit operable to couple memory address signals corresponding to the memory addresses received by the external port to a selected one of the internal address buses;
    a plurality of banks of memory cells coupled to a respective one of the internal address buses;
    a bank coupling circuit for each of the banks of memory cells, the bank coupling circuit being operable to couple the memory address signals from each of the internal address buses to the respective bank;
    a data coupling circuit operable to couple the write data signals from the external port to the banks and to couple the read data signals from the banks to the external data port; and
    a control circuit coupled to the address coupling circuit, the control circuit being operable to apply signals to the address coupling circuit to cause the address coupling circuit to select the internal address bus to which the address signals are coupled, the control circuit comprising:
        a flip-flop having a clock input coupled to receive a signal generated responsive to each of the memory command signals being applied to the external port; and
        a plurality of logic gates coupled to the flip-flop, each of the logic gates generating a respective signal that sequentially selects a respective one of the internal address buses each time the flip-flop toggles.

2. The memory device of claim 1 further comprising a command decoder receiving the memory commands from the external port and decoding the received commands to output corresponding command signals.

3. The memory device of claim 2 further comprising a command bus coupled to receive the command signals from the command decoder, and wherein each of the bank coupling circuits is further operable to couple the command signals from the command bus to the respective bank.

4. The memory device of claim 3 wherein each of the bank coupling circuits receives respective address signals indicative of an access to the respective bank and wherein each of the bank coupling circuits is operable to couple the command signals from the command bus to the respective bank responsive to receiving the address signal indicative of an access to the respective bank.

5. The memory device of claim 1 wherein the address coupling circuit comprises an address multiplexer having an input bus port coupled to receive the memory addresses from the external port and a plurality of output bus ports coupled to respective ones of the plurality of internal address buses.

6. A memory device, comprising:
    an external port adapted to receive memory command signals, memory address signals and write data signals and to transmit read data signals from the memory device;
    a plurality of internal bi-directional data buses that are isolated from each other;
    a data coupling circuit operable to couple write data signals corresponding to write data from the external port to a selected one of the internal data buses, the data coupling circuit further being operable to couple read data signals corresponding to read data from a selected one of the internal data buses to the external port;

a plurality of banks of memory cells coupled to a respective one of the internal data buses;

a bank coupling circuit for each of the banks of memory cells, each of the bank coupling circuits being operable to couple the write data signals from the respective internal data bus to the respective bank and to couple the read data signals from the respective bank to the respective one of the internal data buses;

an addressing circuitry receiving the memory address signals from the external port and being operable to select a memory location in at least one of the banks responsive to the received memory address signals; and control circuitry coupled to the data coupling circuit and the bank coupling circuit, the control circuitry being operable to apply signals to the data coupling circuit to cause the data coupling circuit to select the internal data bus to which the write data signals are coupled and from which the read data signals are coupled, the control circuitry comprising:

a flip-flop having a clock input coupled to receive a signal generated responsive to the memory command signals applied to the external port; and a plurality of logic gates coupled to the flip-flop, each of the logic gates generating a respective signal that sequentially selects a respective one of the internal data buses each time the flip-flop toggles.

7. The memory device of claim 6 wherein the data coupling circuit comprises a data multiplexer having a first bus port coupled to the external port and a plurality of output bus ports coupled to respective ones of the plurality of internal data buses.

8. The memory device of claim 7 wherein the data multiplexer further comprises a second bus port coupled to a respective bank and a plurality of output bus ports coupled to respective ones of the plurality of internal data buses.

9. The memory device of claim 6 wherein the external port comprises a command bus port for receiving the memory command signals, an address bus port for receiving the memory address signals, and a data bus port for receiving the write data signals and outputting the read data signals from the memory device responsive to receiving the memory command signals and the memory address signals.

10. The memory device of claim 6 wherein the control circuitry comprises a plurality of logic gates operable to generate a respective signal that sequentially selects a respective one of the internal address buses.

11. A method of accessing data in a memory device, comprising:

coupling a first memory command to the memory device;

initiating a first memory access in a first bank of memory cells in the memory device responsive to the first memory command, the act of initiating the first memory access comprising prefetching data from the first bank of memory cells to transfer to an external device responsive to the first memory command;

while the first memory access is being processed, coupling a second memory command to the memory device, the second memory command being different from the first memory command; and initiating a second memory access in a second bank of memory cells in the memory device responsive to the second memory command while the first memory access is being processed, the second bank being different from the first bank, the act of initiating the second memory access comprising initiating a prefetch of data from the second bank of memory cells responsive to the second memory command while data are being transferred to the external device responsive to the prefetching of data from the first bank of memory cells.

12. The method of claim 11, further comprising:

while the second memory access is being processed, coupling a third memory command to the memory device; and initiating a third memory access in the first bank of memory cells in the memory device responsive to the third memory command while the second memory access is being processed in the second bank of memory cells.

13. The method of claim 11 wherein the act of initiating the prefetch of data from the second bank of memory cells comprises coupling a memory command and a memory address to the memory device.

14. The method of claim 11 wherein each of the banks have a plurality of pages of memory cells, and wherein the act of prefetching data from the first bank of memory cells comprises prefetching data from less than an entire page of memory cells in the first bank, and wherein the act of initiating the prefetch of data from the second bank of memory cells comprises initiating a prefetch of data from less than an entire page of memory cells in the second bank.

15. A memory device, comprising:

an external port adapted to receive memory command signals, memory address signals and write data signals and to transmit read data signals from the memory device;

a plurality of internal address buses that are isolated from each other;

an address coupling circuit operable to couple memory address signals corresponding to the memory addresses received by the external port to either one of the internal address buses;

a plurality of internal bidirectional data buses that are isolated from each other;

a data coupling circuit operable to couple write data signals corresponding to write data from the external port to either one of the internal data buses, the data coupling circuit further being operable to couple read data signals corresponding to read data from either one of the internal data buses to the external port;

a plurality of banks of memory cells coupled to a respective one of the internal address buses;

a bank coupling circuit for each of the banks of memory cells, the bank coupling circuit being operable to couple the memory address signals from either of the internal address buses to the respective bank; each of the bank coupling circuits being operable to couple the write data signals from either of the internal data buses to the respective bank and to couple the read data signals from the respective bank to either of the internal data buses; and a control circuit coupled to the address coupling circuit, the data coupling circuit and the bank coupling circuit, the control circuit being operable to apply signals to the address coupling circuit to cause the address coupling circuit to select either of the internal address buses to which the address signals are coupled, the control circuit further being operable to apply signals to the data coupling circuit to cause the data coupling circuit to select either of the internal data buses to which the write data signals are coupled and from which the read data signals are coupled, the control circuit comprising:

a flip-flop having a clock input coupled to receive a signal generated responsive to each of the memory command signals being applied to the external port; and a plurality of logic gates coupled to the flip-flop, each of the logic gates generating a respective signal that sequentially selects a respective one of the internal address buses each time the flip-flop toggles.

16. The memory device of claim 15 further comprising a command decoder receiving the memory commands from the external port and decoding the received commands to output corresponding command signals.

17. The memory device of claim 16 further comprising a command bus coupled to receive the command signals from the command decoder, and wherein each of the bank coupling circuits is further operable to couple the command signals from the command bus to the respective bank.

18. The memory device of claim 17 wherein each of the bank coupling circuits receives respective address signals indicative of an access to the respective bank and wherein each of the bank coupling circuits is operable to couple the command signals from the command bus to the respective bank responsive to receiving the address signal indicative of an access to the respective bank.

19. The memory device of claim 15 wherein the address coupling circuit comprises an address multiplexer having an input bus port coupled to receive the memory addresses from the external port and a plurality of output bus ports coupled to respective ones of the plurality of internal address buses.

20. A memory device, comprising:
an external port adapted to receive memory command signals, memory address signals and write data signals and to transmit read data signals from the memory device;
a plurality of internal address buses that are isolated from each other;
an address coupling circuit operable to couple memory address signals corresponding to the memory addresses received by the external port to either one of the internal address buses;
a plurality of internal bidirectional data buses that are isolated from each other;
a data coupling circuit operable to couple write data signals corresponding to write data from the external port to either one of the internal data buses, the data coupling circuit further being operable to couple read data signals corresponding to read data from either one of the internal data buses to the external port;
a plurality of banks of memory cells coupled to a respective one of the internal address buses;
a bank coupling circuit for each of the banks of memory cells, the bank coupling circuit being operable to couple the memory address signals from either of the internal address buses to the respective bank; each of the bank coupling circuits being operable to couple the write data signals from either of the internal data buses to the respective bank and to couple the read data signals from the respective bank to either of the internal data buses; and a control circuit coupled to the address coupling circuit, the data coupling circuit and the bank coupling circuit, the control circuit being operable to apply signals to the address coupling circuit to cause the address coupling circuit to select either of the internal address buses to which the address signals are coupled, the control circuit further being operable to apply signals to the data coupling circuit to cause the data coupling circuit to select either of the internal data buses to which the write data signals are coupled and from which the read data signals are coupled, the control circuit comprising:

a flip-flop having a clock input coupled to receive a signal generated responsive to the memory command signals applied to the external port; and a plurality of logic gates coupled to the flip-flop, each of the logic gates generating a respective signal that sequentially selects a respective one of the internal data buses each time the flip-flop toggles.

21. The memory device of claim 20 further comprising a command decoder receiving the memory commands from the external port and decoding the received commands to output corresponding command signals.

22. The memory device of claim 21 further comprising a command bus coupled to receive the command signals from the command decoder, and wherein each of the bank coupling circuits is further operable to couple the command signals from the command bus to the respective bank.

23. The memory device of claim 20 wherein the address coupling circuit comprises an address multiplexer having an input bus port coupled to receive the memory addresses from the external port and a plurality of output bus ports coupled to respective ones of the plurality of internal address buses.

24. The memory device of claim 20 wherein the data coupling circuit comprises a data multiplexer having a first bus port coupled to the external port and a plurality of output bus ports coupled to respective ones of the plurality of internal data buses.

25. The memory device of claim 24 wherein the data multiplexer further comprises a second bus port coupled to a respective bank and a plurality of output bus ports coupled to respective ones of the plurality of internal data buses.

* * * * *